(12) United States Patent
Miyoshi

(10) Patent No.: US 6,320,240 B1
(45) Date of Patent: Nov. 20, 2001

(54) SEMICONDUCTOR DEVICE AND METHOD OF MANUFACTURING THE SAME

(75) Inventor: Satoru Miyoshi, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/505,063

(22) Filed: Feb. 16, 2000

(30) Foreign Application Priority Data

Mar. 18, 1999 (JP) .................................................. 11-073879

(51) Int. Cl.$^7$ .................................................. H01L 29/00
(52) U.S. Cl. .......................... 257/520; 257/508; 257/390; 257/672; 257/637
(58) Field of Search .................................... 257/501, 506, 257/509, 520, 508, 390, 396; 438/618, 424, 622, 637, 595, 672, 296

(56) References Cited

U.S. PATENT DOCUMENTS

| | | |
|---|---|---|
| 6,074,918 * | 6/2000 | Lee . |
| 6,194,757 * | 2/2001 | Shinkawata . |
| 6,204,161 * | 3/2001 | Chung et al. . |
| 6,235,575 * | 5/2001 | Kasai et al. . |
| 6,242,809 * | 6/2001 | Lee . |

OTHER PUBLICATIONS

Kim et al., A 0.15 $\mu$m DRAM technology node for 4Gb DRAM; 1998 Symposium on VLSI Technology Digest of Technical Papers; pp. 16 and 17.

Kohyama et al., A Fully Printable, Self–aligned and Planarized Stacked Capacitor DRAM Cell technology for 1Gbit DRAM and Beyond; 1997 Symposium on VLSI Technology digest of Technical Papers; pp. 17 and 18.

* cited by examiner

Primary Examiner—Sheila V. Clark
(74) Attorney, Agent, or Firm—Armstrong, Westerman, Hattori, McLeland & Naughton, LLP

(57) ABSTRACT

There are provided a semiconductor device which can prevent short-circuit of the contact plugs and prevent exposure of wirings to ensure sufficient reliability even if level difference is caused in device isolation regions, and a method of manufacturing the same. Device isolation regions 13 are formed on a semiconductor substrate 11 to partition the semiconductor substrate 11 into a plurality of device regions 12. Then, word lines 14 are formed on the semiconductor substrate 11, and then peripheral regions of the word lines 14 are covered with a protection film. Then, impurity diffusion regions formed in the device regions 12, and then a plug insulating film is formed on an overall upper surface of the substrate 11. Then, opening portions 18a for connecting end portions of the device regions 12 are formed in the plug insulating film. Then, a conductive film is buried in the opening portions 18a, and then the conductive film and the plug insulating film are polished by the CMP method until any one of the protection film on the device isolation regions 13 and the protection film on the device regions 12 is exposed.

10 Claims, 19 Drawing Sheets

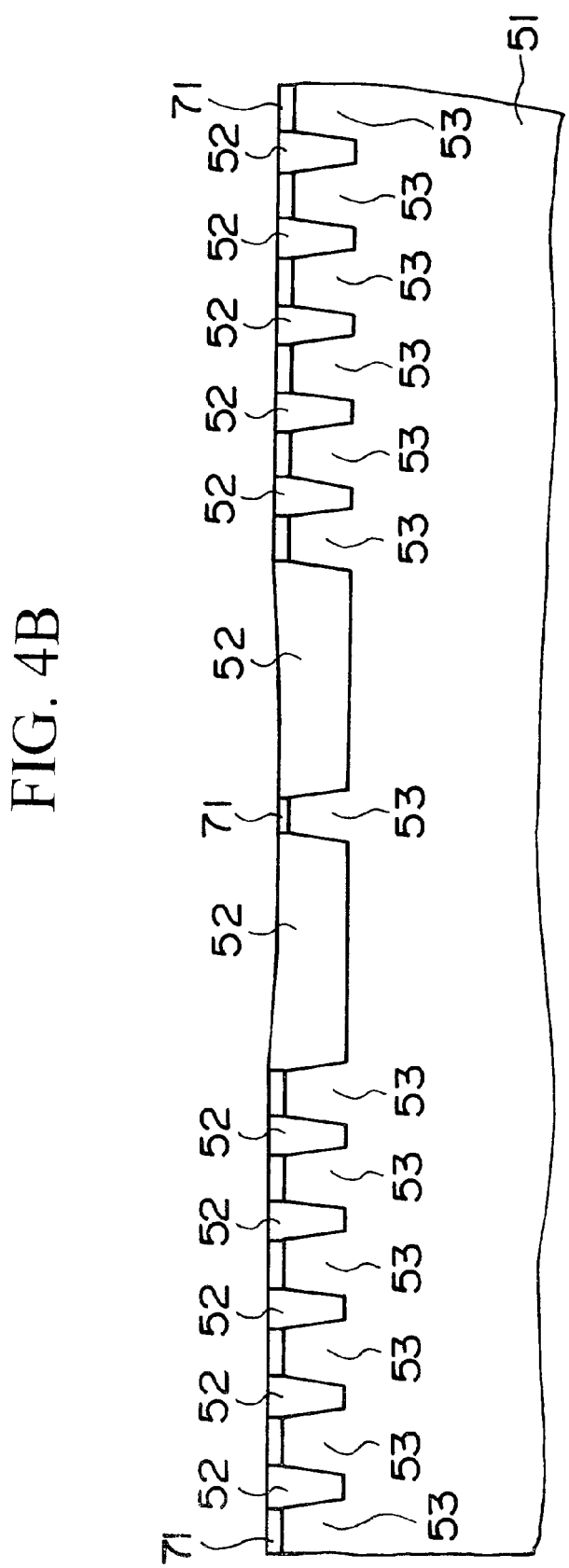

SEMICONDUCTOR DEVICE AND METHOD OF MANUFACTURING THE SAME

BACKGROUND OF THE INVENTION

1. Field of the Invention

The present invention relates to a semiconductor device in which contact plugs for connecting by a self-alignment fashion electrically between impurity diffusion regions formed on a semiconductor substrate and overlying wirings and a method of manufacturing the same.

2. Description of the Prior Art

In recent years, the high integration of LSI (Large Scale Integrated Circuit) is advanced much more, and it is requested to form finely much more respective elements. However, with the progress of miniaturization of the device, it becomes difficult to form the contact plugs which connect electrically the impurity diffusion regions formed on the semiconductor substrate and the wirings.

Normally the contact plugs are formed by using the photolithography technology. More particularly, photoresist is coated on the insulating film formed on the semiconductor substrate, and then the photoresist is exposed via a reticle (exposure mask) having a desired hole pattern. Then, the opening portions are formed in the photoresist by applying the developing process, and then the contact holes are formed in the insulating film by etching the insulating film while using the photoresist as an etching mask. Then, the contact plugs are formed by burying the contact holes by the conductive material.

The contact holes must also be miniaturized according to the miniaturization of the devices. If the hole patterns of the reticle are reduced in size to miniaturize the contact holes, an enough amount of light cannot be irradiated onto the resist in exposure and thus sometimes the holes are not opened. In order to avoid this event, if the hole patterns of the reticle is tried to increase in size so as to increase an exposure amount of light, the neighboring holes are connected mutually.

Therefore, in order to form the fine contact plugs smaller than the resolution of the photolithography, the technologies for manufacturing the contact plugs in a self-alignment fashion have been proposed (Y.Kohyama et al., Sympo. on VLSI Technology Digest, p.17, 1997, K. N. Kim et al. Sympo. on VLSI Technology Digest, p.16, 1998).

FIGS. 1 to 3 are views showing a method of manufacturing a semiconductor device (DRAM: Dynamic Random Access Memory), in which the contact plugs are formed in a self-alignment fashion, in the prior art in the order of step.

As shown in a tip view of FIG. 1A and as shown in a sectional view of FIG. 1B taken along a 1B—1B line in FIG. 1A, the device isolation regions are formed by the buried device isolation (Shallow Trench Isolation: referred simply to as "STI" hereinafter) method. More particularly, the trenches are etched on the semiconductor substrate 51, and then the device isolation regions 52 are formed by burying the trenches by the silicon oxide. The semiconductor substrate 51 is partitioned into a plurality of device regions 53 by the device isolation regions 52. In this example, as shown in FIG. 1A, the device regions 53 are formed like an oval rectangular and arranged like a mosaic pattern. Then, the gate oxide film (not shown) is formed by thermally oxidizing the surface of the device regions 53 on the semiconductor substrate 51.

Then, the polysilicon film, the tungsten silicide film, and the silicon nitride film are formed sequentially on the overall upper surface of the semiconductor substrate 51. Then, as shown in a top view of FIG. 1C and as shown in a sectional view of FIG. 1D, a plurality of word lines 54 which are arranged in parallel mutually are formed. As shown in FIG. 1D, for example, each of the word lines 54 consists of the polysilicon film 56a and the tungsten silicide film 56b. Then, the impurity is introduced into both side portions of the word lines 54 in the device regions 53.

Then, a silicon nitride film is formed on the overall upper surface of the semiconductor substrate 51. Then, the silicon nitride film is left only on both sides of the word lines 54 by anisotropically etching the silicon nitride film to thus form sidewall spacers. A protection film 57 in FIG. 1D consists of the sidewall spacers and the silicon nitride film being formed previously on the word lines 54.

Then, as shown in a top view of FIG. 1E and as shown in a sectional view of FIG. 1F taken along an 1F—1F line in FIG. 1E, a BPSG (Boron-doped Phospho-Silicate Glass) film is formed on the semiconductor substrate 51, and also plug insulating films 61 which have the same shape (oval rectangular) as the device regions 53 respectively are formed at positions adjacent to the device regions 53 by patterning the BPSG film.

Then, as shown in a top view of FIG. 2, as shown in a sectional view of FIG. 3A taken along an 3A—3A line in FIG. 2, and as shown in a sectional view of FIG. 3B taken along a 3B—3B line in FIG. 2, the overall upper surface of the semiconductor substrate 51 is covered with conductive polysilicon, and then the polysilicon is polished by the CMP (Chemical Mechanical Polishing) method until the plug insulating films 61 and the protection film 57 are exposed. Hence, the contact plugs 59 (cross-hatched portions in FIG. 2) are formed by the remaining conductive polysilicon. In turn, contact windows used to form contact between the interlayer insulating film and the contact plugs 59, wirings (bit lines), capacitors, and metal wirings are formed over the semiconductor substrate 51, so that the semiconductor device can be completed.

According to this method, since a size and a position of the contact plug 59 are decided by positions of the word lines 54 and the plug insulating films 61, fine contact plugs can be formed at a high density without the influence of the resolution at the time of exposure.

Normally, it is known that the device isolation regions formed by the LOCOS (Local Oxidation of Silicon) method are protruded from the surface of the substrate. In this case, even if the device isolation regions are formed by the above-mentioned STI method, the device isolation regions are formed to be protruded slightly from the surface of the substrate.

A method of forming the device isolation regions by the STI method and problems caused in the prior art will be explained in detail with reference to FIGS. 4 to 6 hereinafter. Where same reference numerals are affixed in FIGS. 4 to 6 to the same constituent elements as those shown in FIGS. 1 to 3, and their redundant explanation will be omitted hereunder.

To begin with, as shown in FIG. 4A, a silicon nitride film is formed as a stopper film 71 on the semiconductor substrate 51, and then trenches (recesses) 52a are formed on regions acting as the device isolation regions 52. Then, silicon oxide is deposited on the overall upper surface of the semiconductor substrate 51 to bury the trenches 52a and to form a silicon oxide film 72 on the substrate 51.

Then, as shown in FIG. 4B, the stopper film 71 is exposed by polishing the silicon oxide film 72 on the semiconductor substrate 51 by virtue of the CMP method. In this manner, the device isolation regions 52 can be formed.

When the silicon oxide film 72 on the semiconductor substrate 51 is polished by the CMP method, the polishing is quickly proceeded in a portion where the device is formed sparsely (center portion in FIG. 4A: also referred to as an "isolated device portion" hereinafter), so that the phenomenon called the dishing, i.e., the surface of the center portion is dented, is caused. Therefore, though the stopper film 71 made of silicon nitride (SiN) has a smaller polishing rate to the silicon oxide film 72, a capability of the stopper film deteriorates in the portions where the stopper film patterns are sparsely formed, thus the thick stopper film 71 remains in portions where the devices are formed densely, as shown in FIG. 4B, if the polishing is carried out to remain the stopper film 71 in the isolated device portion. Then, after the stopper film 71 has been removed, the device isolation region 52 is protruded from the surface of the device region 53 by a thickness of the stopper film 71 (e.g., 60 nm). Accordingly, it is difficult to reduce the projection height of the device isolation region 52.

Then, as shown in FIG. 4C, the word lines 54 and the protection films 57 are formed. In this case, if the surface of the device isolation region 52 is projected higher than the surface of the device region 53, the upper surface position of the protection films 57 formed on the device region 53 is different from the upper surface position of the protection films 57 formed on the device isolation region 52 by the projection height (indicated by H in FIG. 4C) of the device isolation region 52. Then, a plug insulating film 61 is formed on the overall upper surface of the substrate 51, then opening portions are provided on regions where the contact plugs are formed, and then a conductor film 74 is formed to bury the opening portions. Then, the contact plugs are formed by CMP-polishing the conductor film 74 and the plug insulating film 61. In this case, in order to prevent the short-circuit of the neighboring contact plugs, the conductor film 74 and the plug insulating film 61 must be polished until the upper surfaces of the protection films 57 formed on the device region.

In the meanwhile, as shown in FIG. 4C, a small projection is formed on the conductor film 74 and the plug insulating film 61 in the portions where the devices are formed sparsely, while a large projection is formed on the conductor film 74 and the plug insulating film 61 in the portions where the devices are formed densely. When the conductor film 74 and the plug insulating film 61 are polished by the CMP method, the small projected area is polished easily rather than the large projected area and the dishing occurs in the portions where the devices are formed sparsely. Therefore, if the conductor film 74 and the plug insulating film 61 are polished until the contact plugs can be isolated electrically, the gate electrodes 54 may be exposed in the portions where the devices are formed sparsely, as shown in FIG. 4D, in extreme cases, sometimes the gate electrodes 54 are also polished and disappear. In addition, since the upper surface of the semiconductor substrate 51 is not polished flat because of the dishing, displacement of focus is caused by the succeeding exposure step.

For example, an amount of projection of the device isolation regions 52 is set to 60 nm, a height of the protection films 57 is set to about 400 nm, a thickness of the plug insulating film 61 is 600 nm, and an amount of reduction in the film thickness of the protection films 57 on the word lines 54 is set to 40 nm at the time of etching when the opening portions are formed in the plug insulating film 61. At this time, a difference between the upper surface position of the protection films 57 formed on the device isolation region 52 and the upper surface position of the protection films 57 formed on the device region 53 becomes about 100 nm. Accordingly, the protection films 57 on the device isolation region 52 must be polished by 100 nm or more. However, if an amount of polishing is increased in this manner, the upper portions of the protection films 57 disappear in the isolated device portion due to the polishing to thus expose the gate electrodes 54, so that the reliability of the semiconductor device is extremely lowered.

In order to reduce the projection height of the device isolation region 52, it may be considered that the silicon oxide buried in the trenches is etched by using the hydrofluoric acid solution, for example. However, in removing the stopper film, an edge portion of the device isolation region is etched to thus form a concave portion 52b, as shown in FIG. 5A. If the projection height of the device isolation region 52 is reduced by the etching, a depth of the concave portion 52b is increased, as shown in FIG. 5B. Thus, when the conductor (a part of the word lines 54) is buried in the concave portion 52b, a parasitic transistor is formed. Because of this parasitic transistor, as shown in FIG. 6, hump appears in a VG-ID characteristic wherein an abscissa denotes a gate voltage and an ordinate denotes a drain current in logarithmic unit, whereby the influence of the parasitic transistor can be watched. According to this parasitic transistor, the threshold voltage of the MOS transistor is lowered, and off-leak is increased. These events come up to the increase in the stand-by current of the transistor, reduce operational margin of the circuit, and cause the defective operation.

SUMMARY OF THE INVENTION

Therefore, it is an object of the present invention to provide a semiconductor device which can prevent the short-circuit between contact plugs and prevent exposure of wirings to ensure sufficient reliability even if level difference is caused in device isolation regions, and a method of manufacturing the same.

The above subjects can be overcome by providing a semiconductor device, as shown in FIGS. 7I, 7J and 8, which comprises a semiconductor substrate 11; a plurality of device regions 12 formed on the semiconductor substrate 11 along a first direction; device isolation regions 13 provided between the device regions 12; impurity diffusion regions 20 formed in the device regions 12 on the semiconductor substrate 11; a plurality of conductive layers 14 formed over the semiconductor substrate 11 along a second direction which intersects with the first direction; a first insulating film 17 for covering the conductive layers 14; a second insulating film 18 formed on the first insulating film 17 on the device regions 12; and a plurality of contact plugs 19 which are isolated electrically mutually by the first insulating film 17 on the device isolation regions 13 and the first insulating film 17 and the second insulating film 18 on the device regions 12, and are connected electrically to the impurity diffusion regions 20.

For example, if level difference is caused between the surfaces of the device regions and the surfaces of the device isolation regions, the conductive film must be polished to form the contact plugs by the prior art until the protection film on the device regions is exposed. However, in the present invention, since the second insulating film still remains on the first insulating film (protection film) on the device regions, the contact plugs can be isolated electrically without the polishing to expose the first insulating film on the device regions.

In this case, the contact plugs may be formed of polysilicon having conductivity, metal such as copper (Cu), tungsten (W), etc., or their alloy, for example.

The above subjects can be overcome by providing a method of manufacturing a semiconductor device, as shown in FIGS. 7A to 7J, which comprises the steps of partitioning a semiconductor substrate 11 into a plurality of device regions 12 by forming device isolation regions 13 on the semiconductor substrate 11; forming a first insulating film 15 on at least the device regions 12; forming a plurality of conductive layers 14 to pass over the device isolation regions 13 and the device regions 12; forming impurity diffusion regions 20 by introducing impurity into the semiconductor substrate 11 on both sides of the conductive layers 14 in the device regions 12; covering peripheral regions of the conductive layers 14 with a second insulating film 17; forming a third insulating film 18 on an overall upper surface of the semiconductor substrate 11 containing the second insulating film 17; forming opening portions 18a in the third insulating film to extend over the plurality of device regions 12 and to reach the impurity diffusion regions 20 respectively; forming a conductive film 30 to bury the opening portions 18a by depositing conductor on the semiconductor substrate 11 containing the third insulating film 18; and removing the third insulating film 18 and the conductive film 30 until at least one of the second insulating film 17 over the device isolation regions 13 and the second insulating film 17 over the device regions 12 is exposed, to electrically mutually isolate the conductor buried in the opening portions 18a, whereby contact plugs 19 are formed.

In the present invention, first the device isolation regions are formed on the semiconductor substrate to partition the semiconductor substrate into a plurality of device regions, and then the first insulating film (gate insulating film) is formed on the device regions. In this case, the surfaces of the device isolation regions may be formed to protrude upward rather than the surfaces of the device regions.

Then, the conductive layer acting as the gate of the MOS transistor device with the second insulating film (protection film) on a top is formed, and the impurity is introduced into the device regions on both sides of the conductive layer. Then, peripheral regions of the conductive layers are covered with the second insulating film (protection film), and anisotropically etched.

Then, the third insulating film (plug insulating film) is formed by depositing the insulator on the overall upper surface of the semiconductor substrate. Then, the opening portions are formed in the third insulating film to extend over the plurality of device regions and to reach the impurity diffusion regions respectively. In the present invention, since the opening portions are formed in the third insulating film in this manner, the third insulating film still remains on the second insulating film on the device regions, but the third insulating film does not exist on the second insulating film on the device isolation regions.

Then, the conductive film which is formed of the impurity-doped polysilicon, metal such as copper, tungsten, etc., their alloy, or the like is deposited on the upper surface of the semiconductor substrate so as to bury the opening portions formed in the insulating film. Then, the insulating film and the conductive film are removed by the CMP method, for example, until the conductor buried in the opening portions in the second insulating film can be Isolated electrically mutually. In this case, in the present invention, since the third insulating film still remains on the second insulating film on the device regions, the short-circuit between the contact plugs on the device regions can be prevented even if the CMP is terminated at a point of time when the second insulating film on the device isolation regions is exposed. In addition, in the method of the present invention, when a polishing amount of the second insulating film may be reduced, the event that the wirings (conductive layers) are exposed in the isolated device portion can be avoided.

In this case, in the method of the present invention, since the second insulating film on the device isolation regions and the second insulating film on the device regions are exposed substantially at the same time by the CMP-polishing if the polishing amount of the second insulating film may be reduced, it is impossible to say that the third insulating film always remains on the second insulating film on the device regions.

BRIEF DESCRIPTION OF THE DRAWINGS

FIGS. 4A to 4D are sectional views showing a method of forming a device isolation region according to an STI method and problems in the prior art respectively;

DESCRIPTION OF THE PREFERRED EMBODIMENTS

Embodiments of the present invention will be explained with reference to the accompanying drawings hereinafter.

(First Embodiment)

FIGS. 7A to 7J are sectional views showing a method of manufacturing a semiconductor device (DRAM) according to a first embodiment of the present invention in the order of steps. FIG. 8 is a top view showing a semiconductor substrate formed in steps shown in FIG. 7G. In this case, FIGS. 7A to 7J show the sectional shapes taken along an A—A line in FIG. 8 respectively.

Figure 1A:
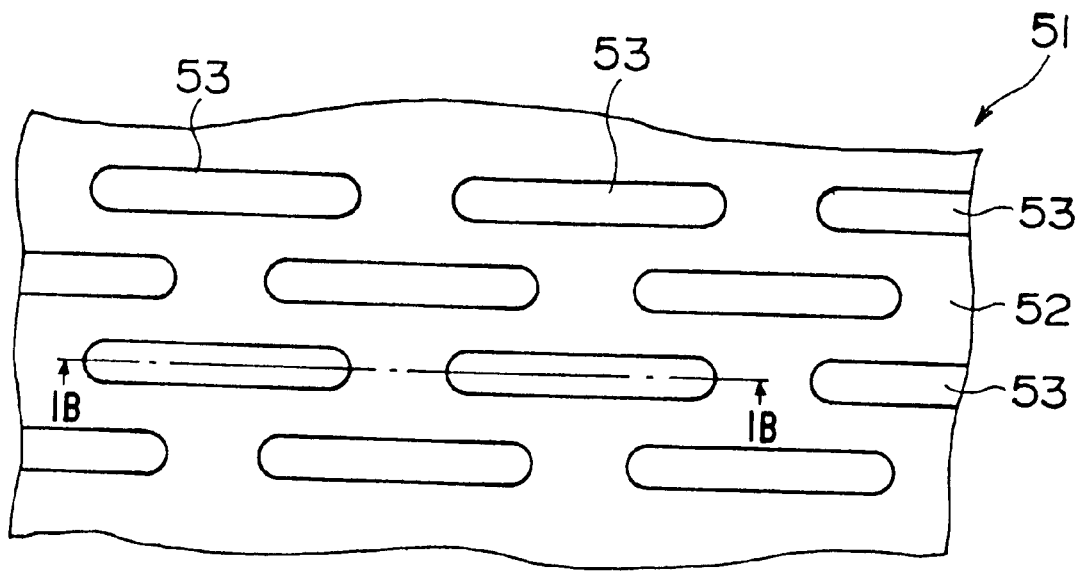
FIGS. 1A to 1F are sectional views showing a method of manufacturing a semiconductor device (DRAM) in the prior art.
Figure 1B:
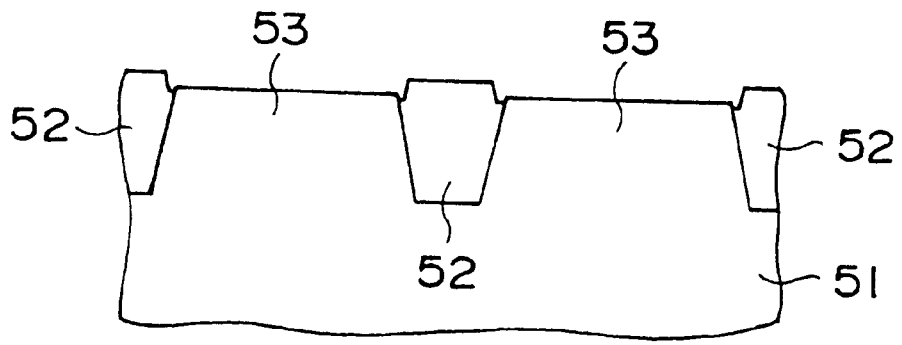
Figure 1C:
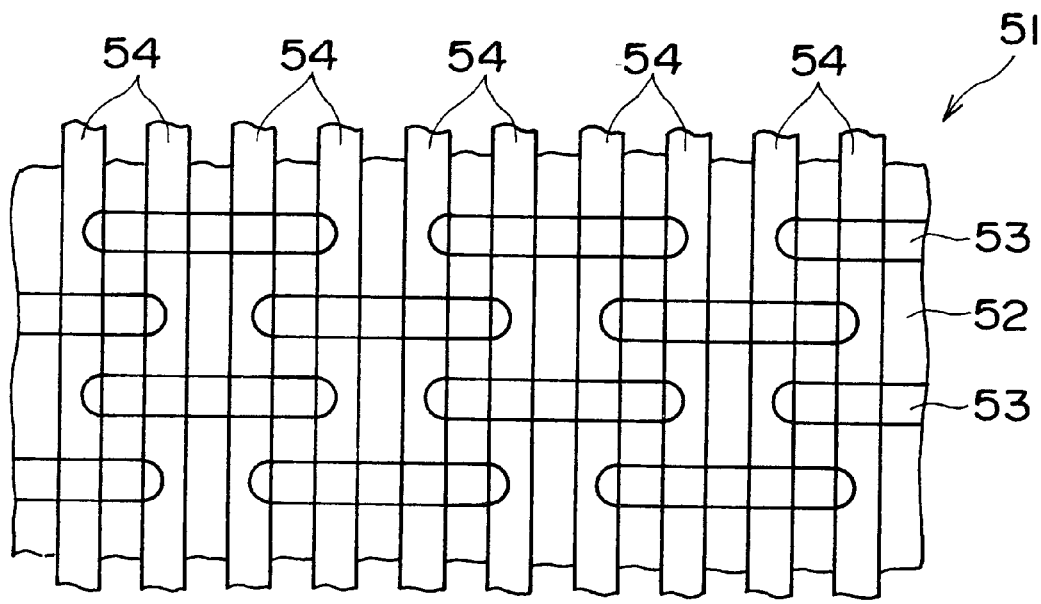
Figure 1D:
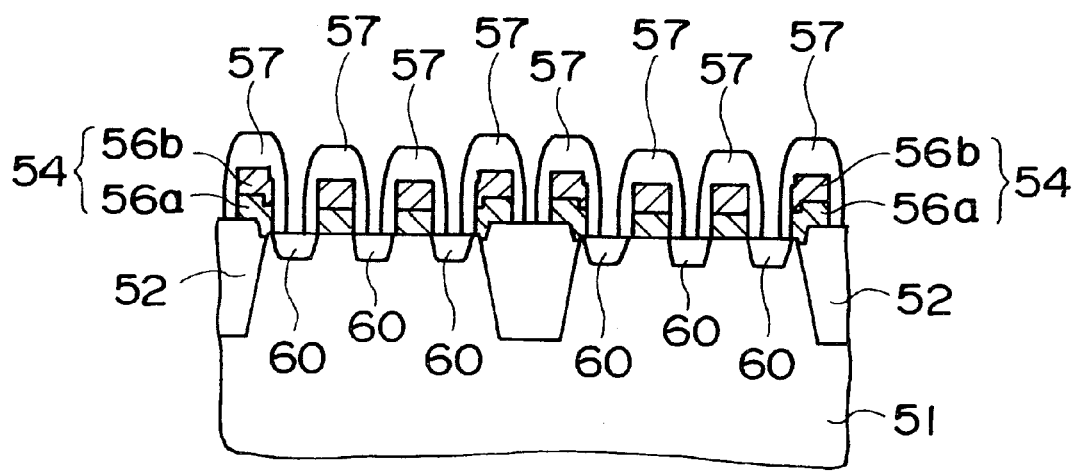
Figure 1E:
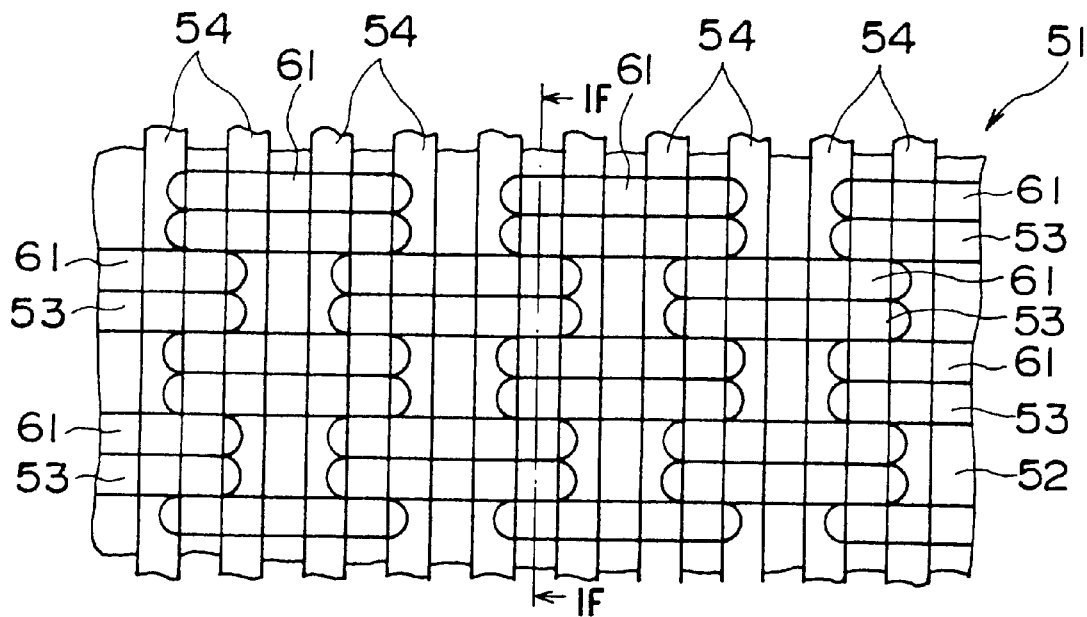
Figure 1F:
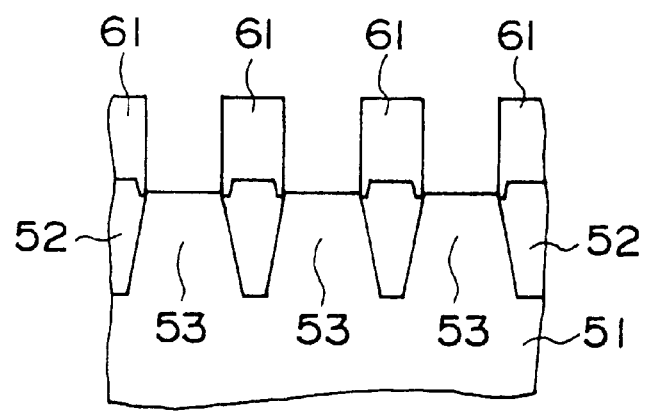
Figure 2:
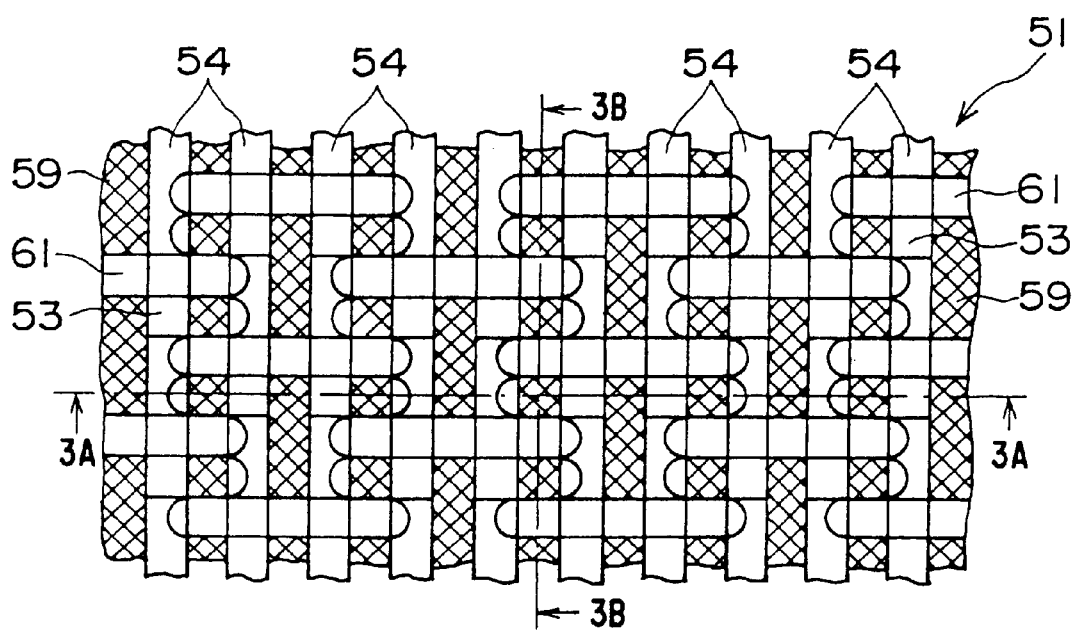
FIG. 2 is a top view showing the semiconductor device (DRAM) in the prior art.
Figure 3A:
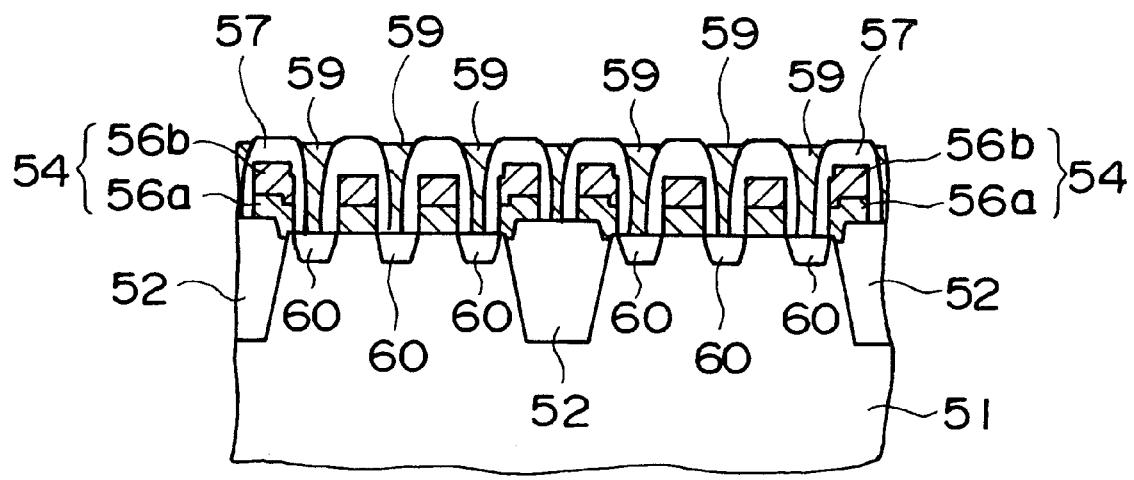
FIG. 3A is a sectional view showing a sectional shape taken along an 3A—3A line in FIG. 2.
Figure 3B:
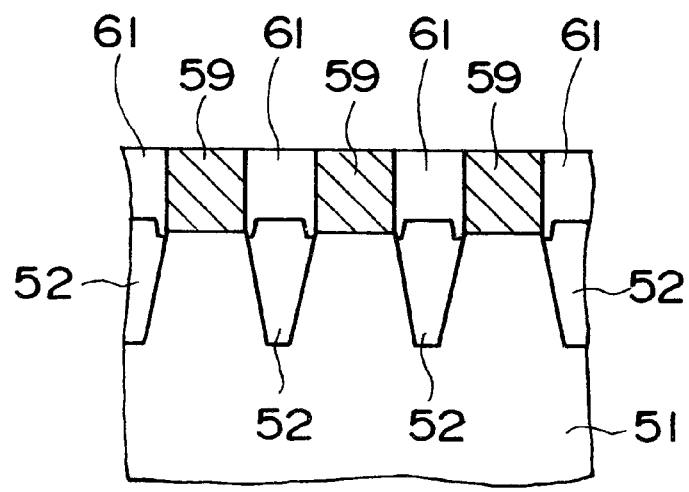
FIG. 3B is a sectional view showing a sectional shape taken along a 3B—3B line in FIG. 2.
Figure 4A:
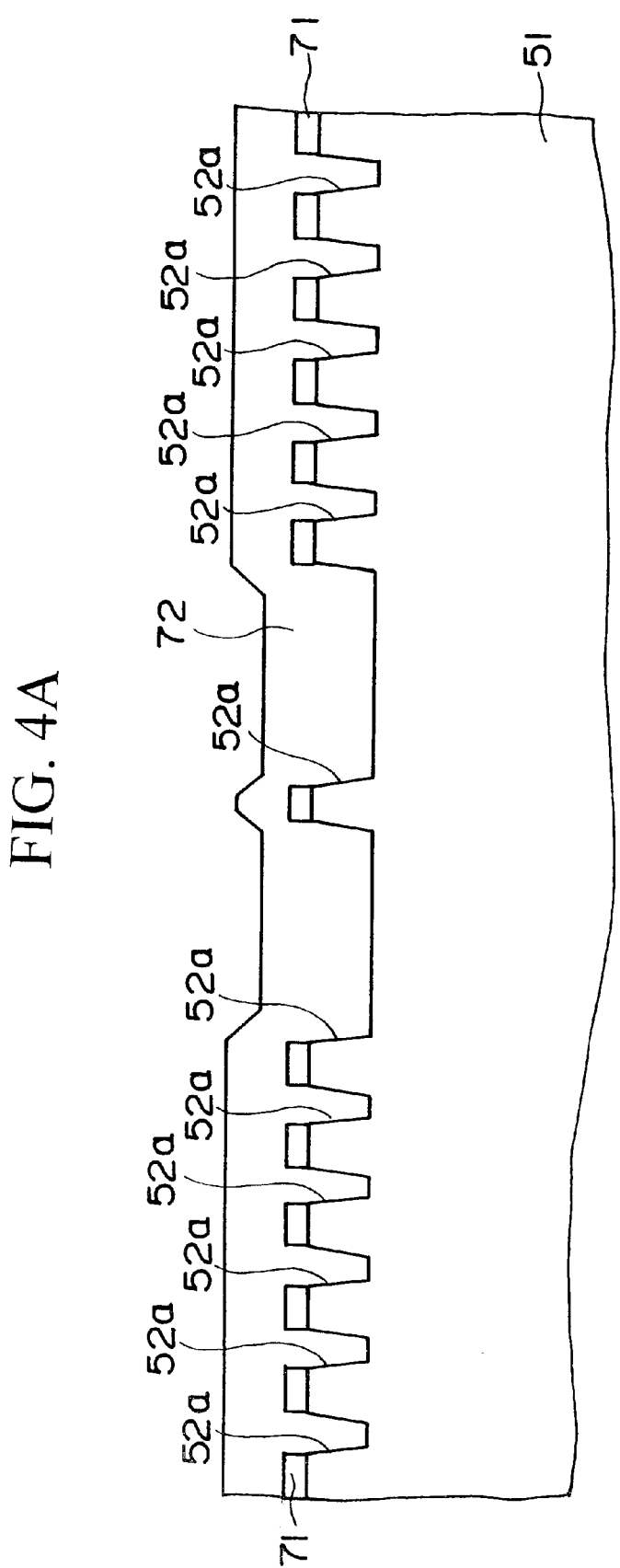
Figure 4C:
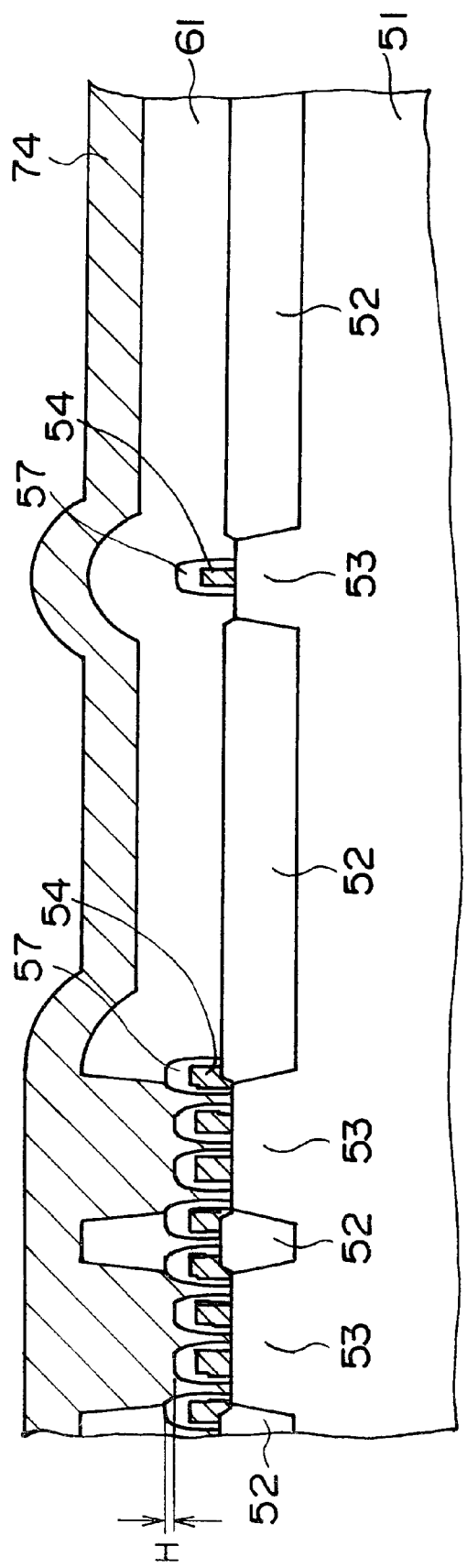
Figure 4D:
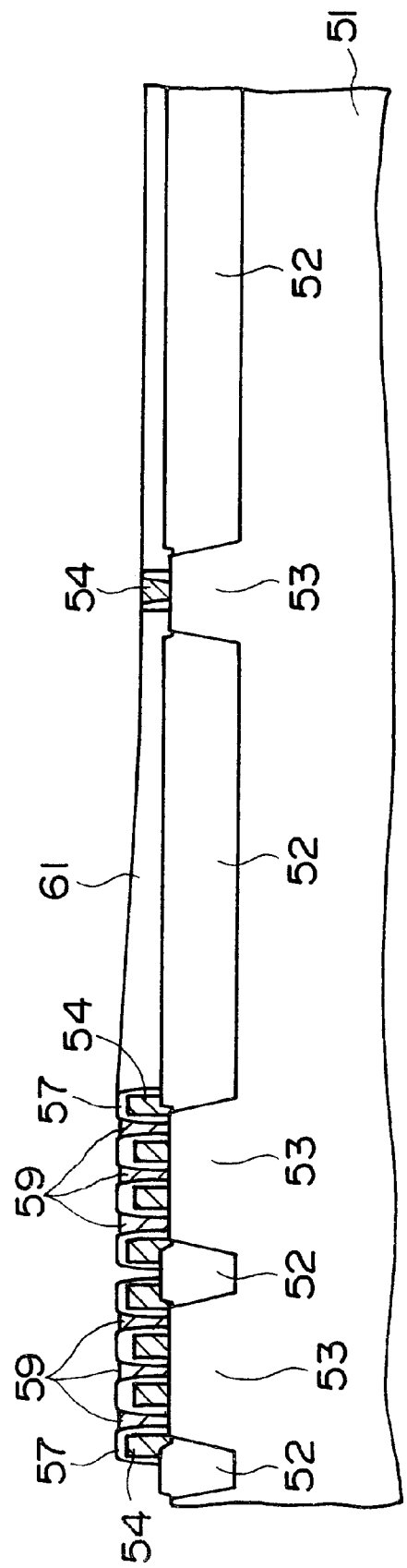
Figure 5A:
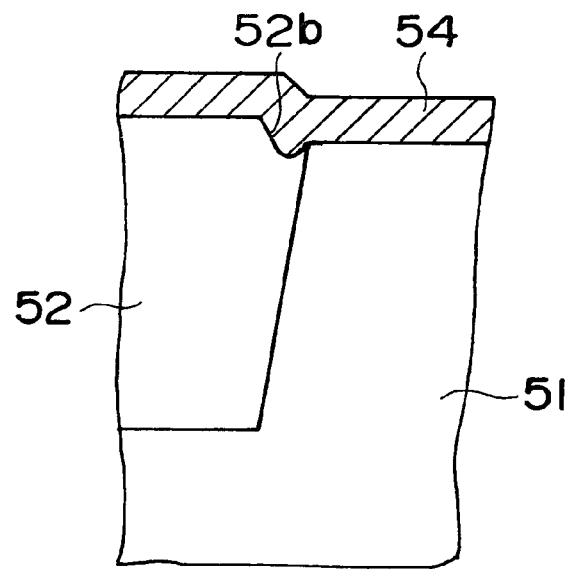
FIGS. 5A and 5B are sectional views showing problems caused when a projection height of the device isolation region is reduced by the etching.
Figure 5B:
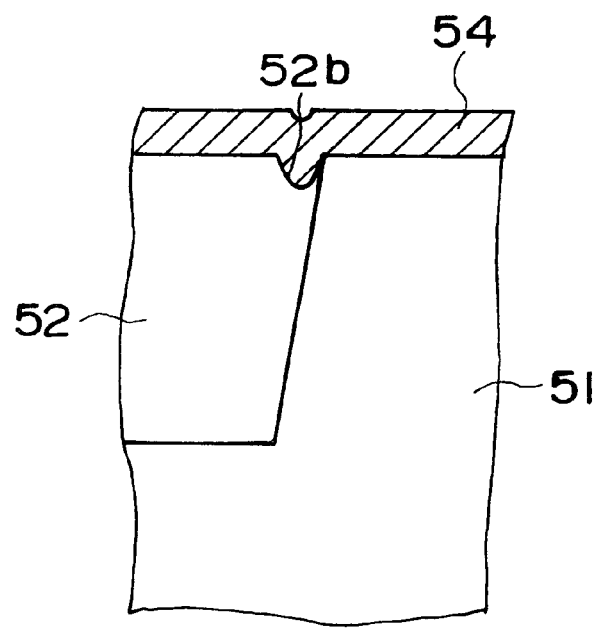
Figure 6:
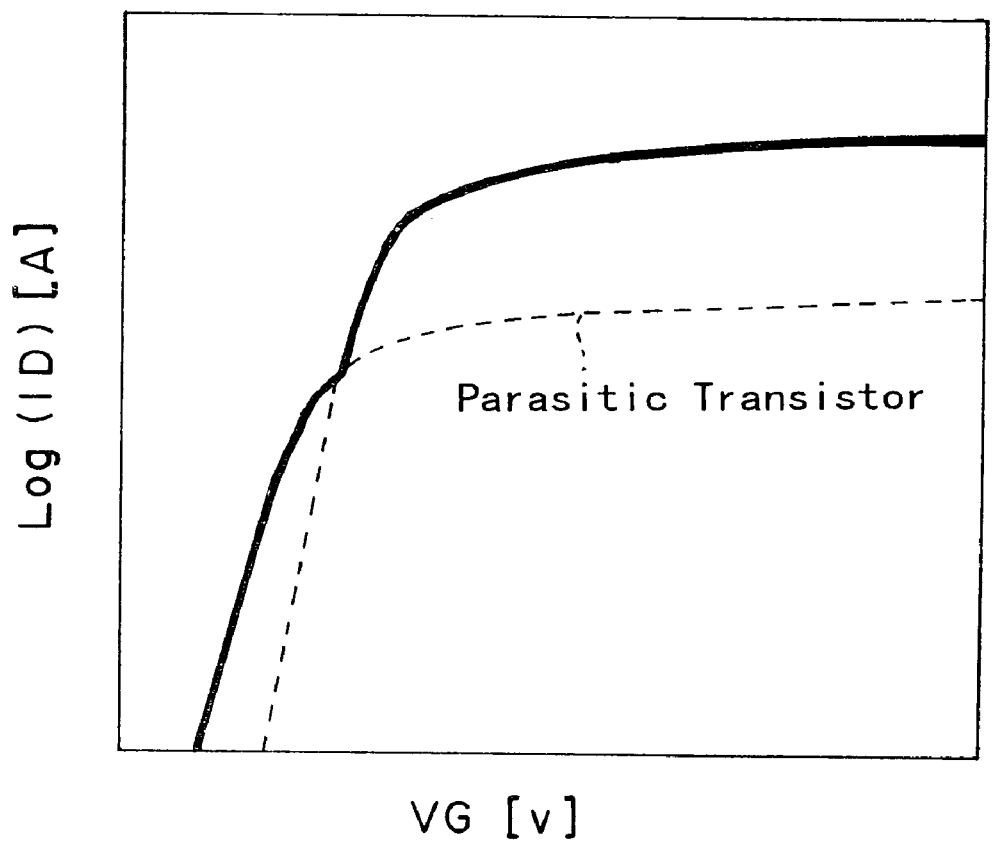
FIG. 6 is a graph showing a problem caused when a projection height of the device isolation region is reduced by the etching, i.e., influence of a parasitic transistor upon a VG-ID characteristic.
Figure 7A:
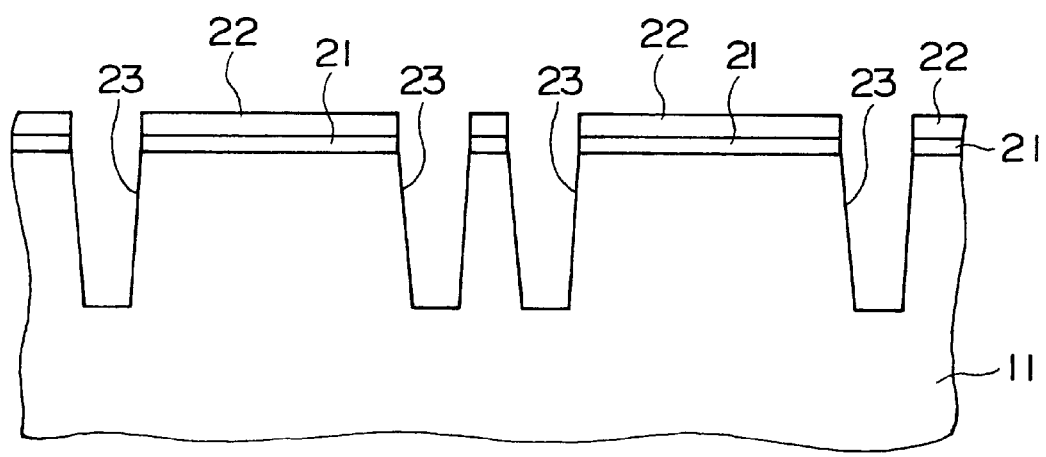
FIGS. 7A to 7J are sectional views showing a method of manufacturing a semiconductor device (DRAM) according to a first embodiment of the present invention.
Figure 8:
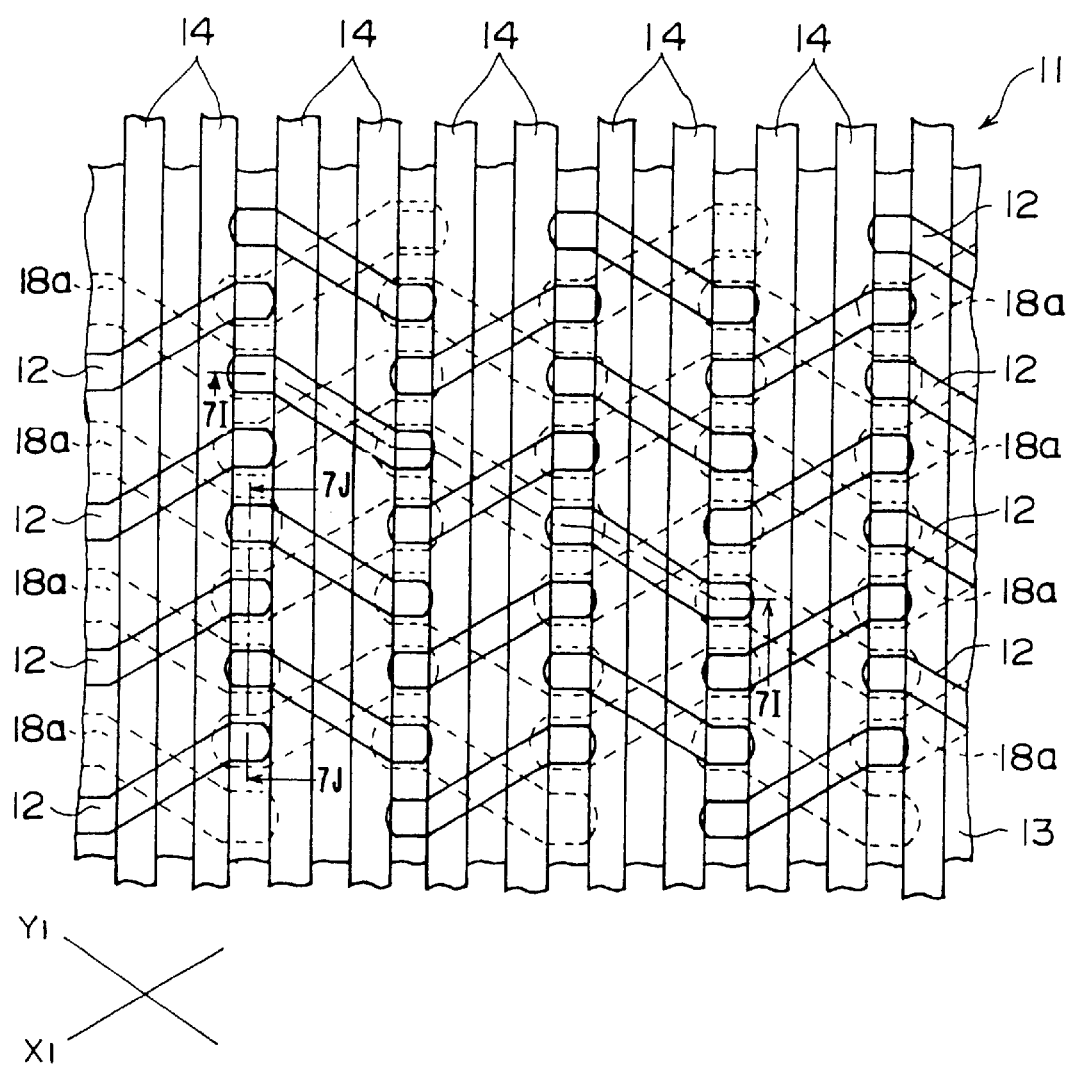
FIG. 8 is a top view showing a semiconductor substrate formed in steps shown in FIG. 7G.

First, as shown in FIG. 7A, a silicon oxide film 21 is formed on a surface of a silicon substrate 11 by the thermal oxidation. Then, a silicon nitride film (SiN film) 22 is formed on the silicon oxide film 21 by the CVD method, etc.

Then, the silicon nitride film 22 and the silicon oxide film 21 are patterned by the photolithography and dry etching to expose surface regions of portions of the silicon substrate 11 acting as device isolation regions. Then, trenches (recesses) 23 are formed by etching the exposed portions of the silicon substrate 11. In the first embodiment, as shown in FIG. 8, device regions 12 are formed at a constant interval along straight lines which are in parallel with two straight lines X1, Y1, which are intersected with each other at angle of about 60 degree, respectively. The trenches 23 are formed in regions except the device regions 12 on the semiconductor substrate 11.

Figure 7B:
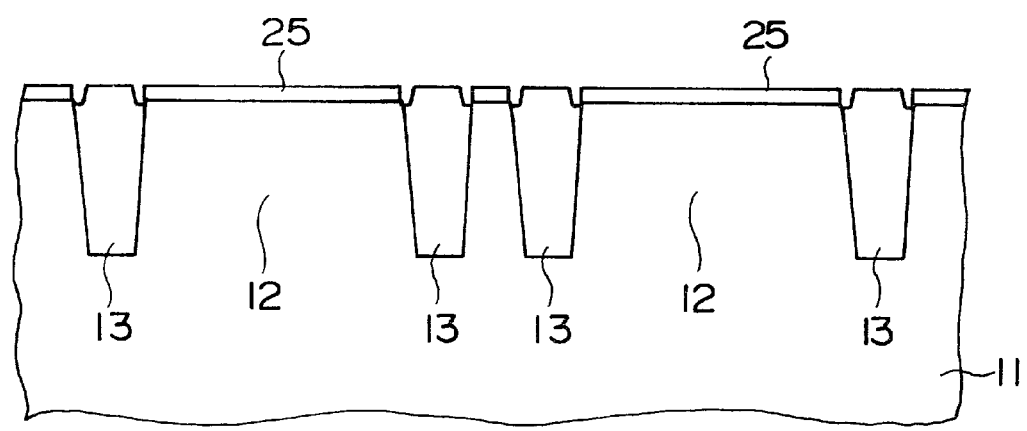

Next, oxide films (not shown) are formed on inner wall surfaces of the trenches 23 by the thermal oxidation respectively. Then, silicon oxide is deposited on an overall upper surface of the substrate 11 by the HDPCVD (High Density Plasma Chemical Vapor Deposition) method such that the trenches 23 are buried by the silicon oxide. Then, the silicon oxide film formed on the substrate 11 is polished by the CMP method to expose the silicon nitride film 22. In this case, since a polishing rate of the silicon nitride film 22 is smaller than the silicon oxide film, the surface of the silicon substrate 11 can be protected by the silicon nitride film 22. Accordingly, as shown in FIG. 7B, device isolation regions 13 consisting of silicon oxide which is buried in the trenches 23 are formed, and thus respective device regions 12 are defined by the device isolation regions 13.

Then, the silicon nitride film 22 and the silicon oxide film 21 are removed. Then, a thin oxide film 25 called a through oxide film is formed by oxidizing the surface of the silicon substrate 11. Then, a resist pattern (not shown) is formed on the through oxide film 25, and then impurity is ion-implanted by using the resist pattern as a mask so as to form wells deciding a threshold voltage of the MOS transistor in the device regions 12. Then, the resist pattern is removed.

Figure 7C:
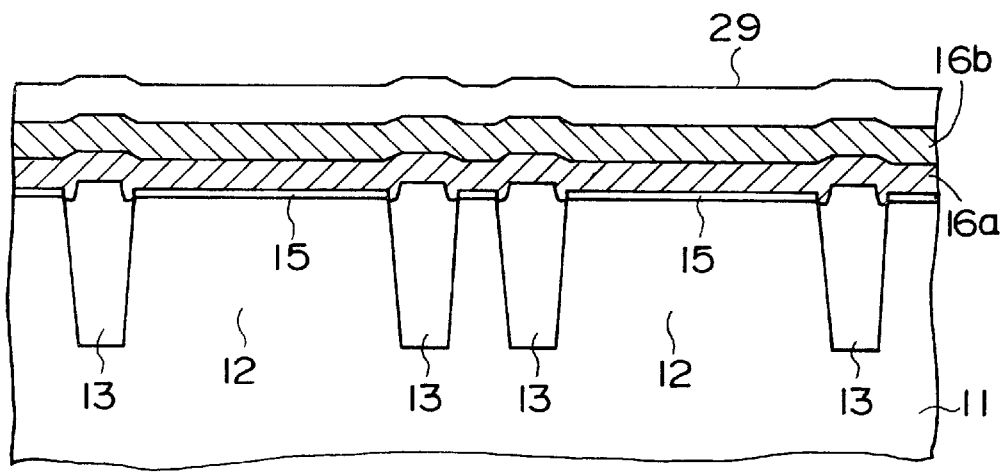

Then, as shown in FIG. 7C, the through oxide film 25 is removed and then a gate oxide film 15 is formed by thermally oxidizing surfaces of the device regions 12 on the silicon substrate 11. Then, an amorphous silicon film 16$a$ and a tungsten silicide film 16$b$ are formed sequentially on the overall upper surface of the substrate 11. the amorphous silicon film 16$a$ exhibits conductivity by doping P(phosphorus) of $1.4 \times 10^{21} cm^{-3}$ for example. Also, a thickness of the tungsten silicide film 16$b$ is set to 100 nm, for example.

Figure 7D:
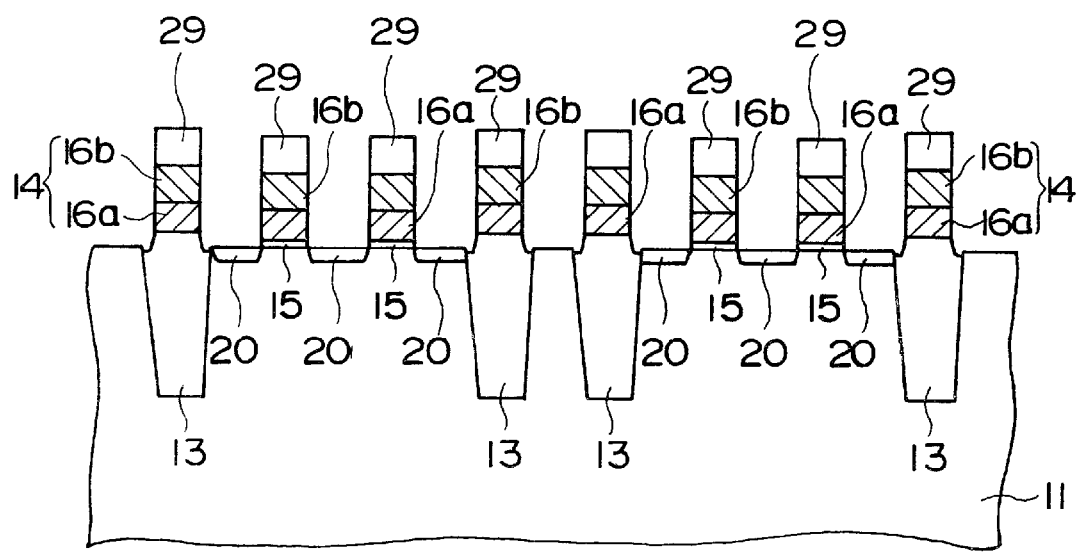
Figure 7E:
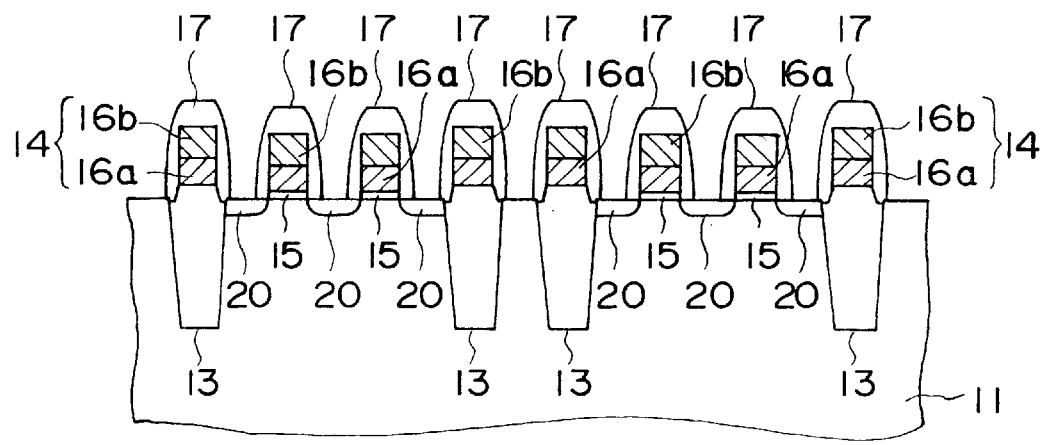

Then, a silicon oxi-nitride (SiON) film (not shown) is formed as an anti reflection preventing film on the tungsten silicide film 16$b$ to have a thickness of 40 nm. Then, a silicon nitride (SiN) film 29 is formed on the silicon oxi-nitride film by the LPCVD (Low Pressure Chemical Vapor Deposition) method to have a thickness of 132 nm. Then, a photoresist pattern (not shown) is formed on the silicon nitride film 29. Then, as shown in FIG. 7D, the silicon nitride film 29, the silicon oxi-nitride film, the tungsten silicide film 16$b$, and the amorphous silicon film 16$a$ are patterned by using the photoresist pattern as a mask. Accordingly, word lines 14 each consisting of the amorphous silicon film 16$a$ and the tungsten silicide film 16$b$ are formed. In the first embodiment, as shown in FIG. 8, two word lines 14 extend over the device regions 12 respectively.

Then, while using the word lines 14 and the silicon nitride film 29 as a mask, the impurity is introduced into the device regions 12 located on both side portions of the word lines 14. Thus, impurity diffusion regions (LDD (Lightly Doped Drain) diffusion regions) 20 are formed in a self-alignment fashion.

Then, a silicon nitride film of 60 nm thickness is formed on the overall upper surface of the substrate 11 by the LPCVD method. Then, sidewall spacers are formed on both side surfaces of the word lines 14 by anisotropically etching the silicon nitride film. Each of protection films 17 shown in FIG. 7E consists of the sidewall spacers and the silicon nitride film 29 formed on the word line 14. In this case, a gate oxide film and gate electrodes are formed on peripheral circuit portions (not shown) together with the gate oxide film 15 and the word lines 14 in cell regions, and the impurity is introduced into the semiconductor substrate located on both sides of the gate electrodes at a high concentration to thus form transistors.

Then, a blanket silicon nitride film (not shown) of 20 nm thickness is formed as a stopper film on the overall upper surface of the substrate 11 by the LPCVD method. This silicon nitride film is formed to prevent the digging of the oxide film in the device isolation regions 13, which is caused in etching a plug insulating film 18 in the postprocessing.

Figure 7F:
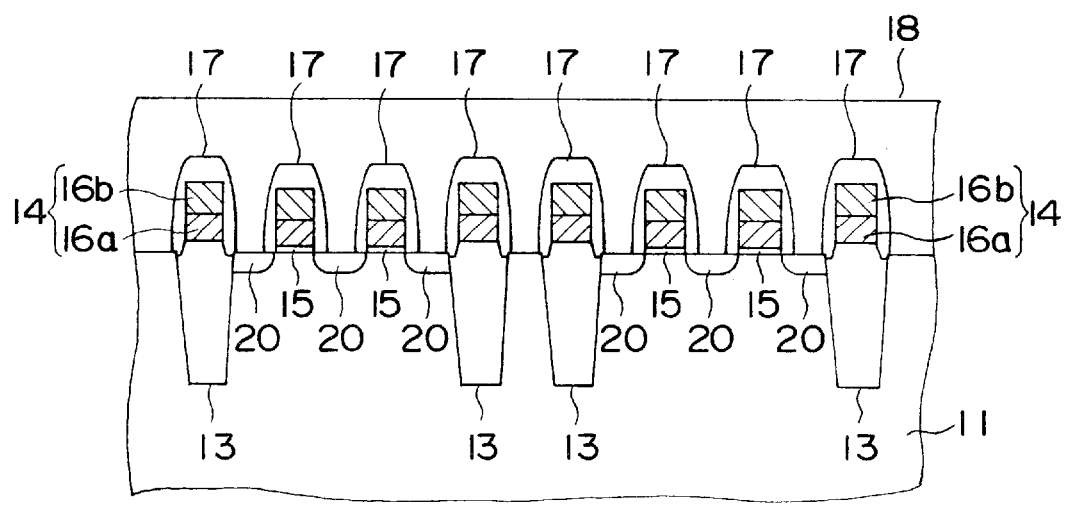

Then, as shown in FIG. 7F, a plug insulating film 18 is formed on the overall upper surface of the substrate 11 to have a thickness of about 600 nm. This plug insulating film 18 is formed BPSG using TEOS (Tetra-Etoxy Silane: $Si(OC_2H_5)_4$), for example. Then, a surface of the plug insulating film 18 is planarized by heating at a temperature of 800° C. to flow BPSG. In this case, higher flatness of the surface may be assured by polishing the surface of the plug insulating film 18 after the flow.

Figure 7G:
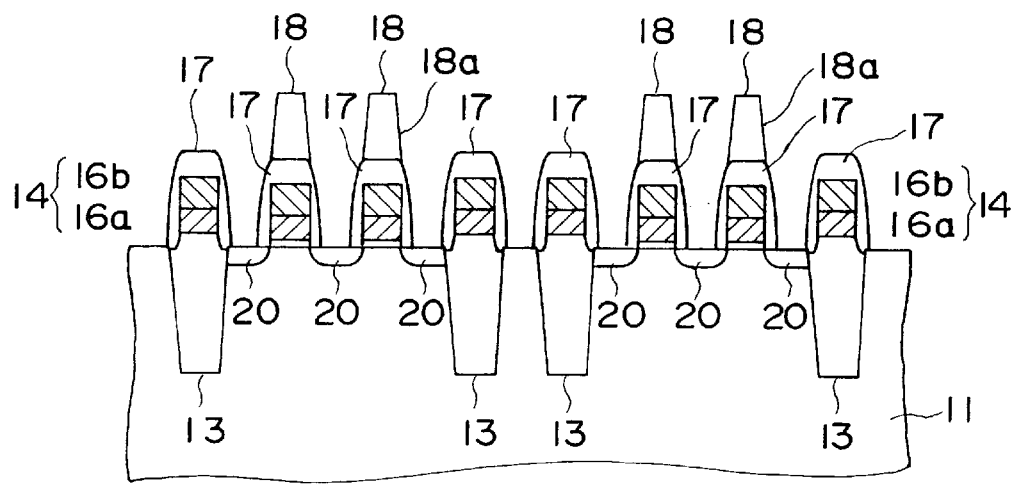

Then, a resist pattern (not shown) is formed on the plug insulating film 18. As shown in FIG. 7G, opening portions 18$a$ are formed in the plug insulating film 18 and the blanket silicon nitride film by anisotropically etching the plug insulating film 18 while using the resist pattern as a mask, under the multi-step etching condition that firstly the plug insulating film 18 is etched selectively, and then the blanket silicon nitride film is etched. As shown in FIG. 8, each of the opening portions 18$a$ is formed to have a profile which connects end portions of the device regions 12 being aligned on a straight line. In other words, each opening portions 18$a$ is formed to extend between two device regions 12 and to expose the impurity diffusion region 20 located at the end portion of each device region 12. In this case, since the opening portions 18$a$ are relatively large patterns, they can be easily formed by the photolithography.

Figure 7H:
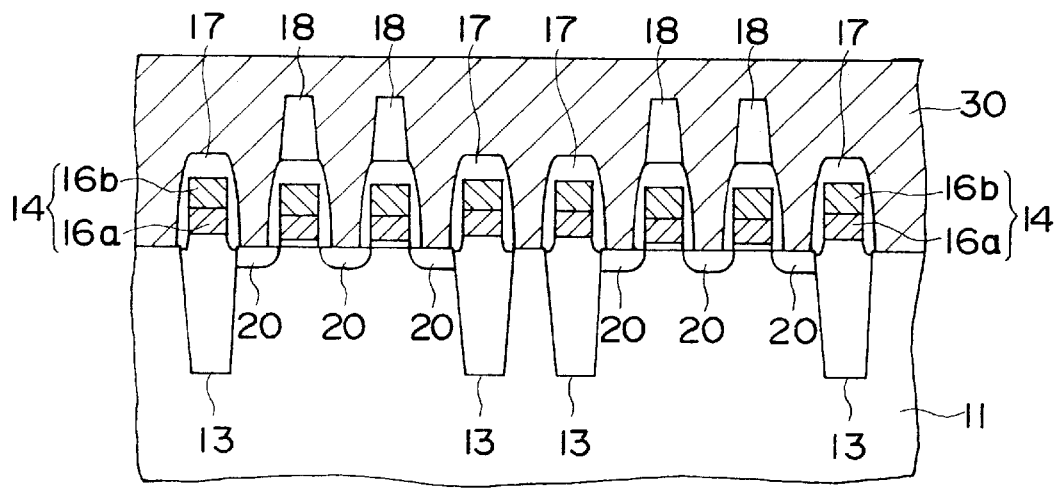

Then, as shown in FIG. 7H, an amorphous silicon film 30 whose P (phosphorous) concentration is $5.0 \times 10^{20}$ cm$^{-3}$, for example, is formed on the overall upper surface of the substrate 11 to have a thickness of about 200 nm. In this case, a metal film such as copper, tungsten, or the like, or an alloy film may be formed in place of the amorphous silicon film 30.

Then, under the condition that polishing rates of the polysilicon and the BPSG are substantially equal, the amorphous silicon film 30 and the plug insulating film 18 are polished by the CMP method to expose the protection film 17 on the device isolation regions 13. In this manner, as shown in the sectional view in FIG. 7I taken along an 7I—7I line in FIG. 8 and as shown in the sectional view in FIG. 7J taken along a 7J—7J line in FIG. 8, contact plugs 19 which are connected electrically to the impurity diffusion regions 20 are formed in a self-alignment fashion, and such contact plugs 19 are isolated electrically mutually. Then, contact windows used to form contact between an interlayer insulating film and the contact plugs 19, wirings (bit lines), capacitors, and metal wirings are formed by the well known method. Like the above, the semiconductor device according to the present invention can be completed.

Figure 7I:
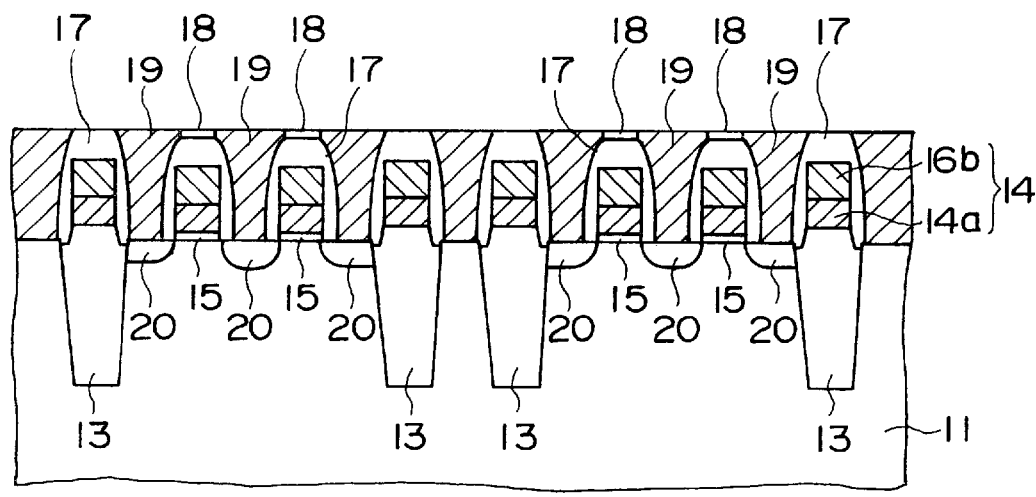
Figure 7J:
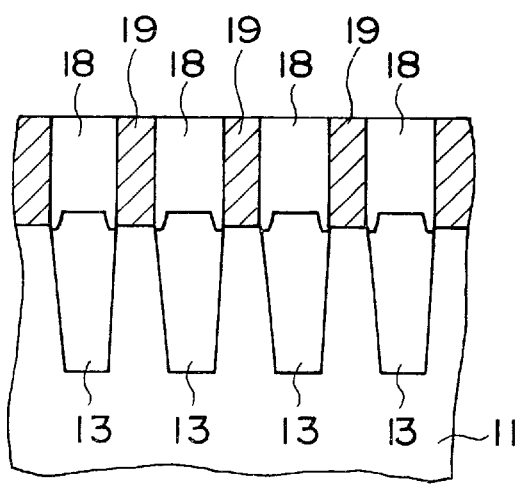

In the first embodiment, as shown in FIG. 7I, the plug insulating film (BPSG film) 18 still remains on the protection film 17 on the device regions 12, but the plug insulating film 18 does not remain on the protection film 17 on the device isolation regions 13. Hence, even if the polishing is stopped at a point of time when the protection film 17 on the device isolation regions 13 is exposed, the plug insulating film 18 still remains over the word lines 14 in the device regions 12, so that the neighboring contact plugs 19 are in no means short-circuited. Accordingly, since there is no necessity to polish the protection film 17 excessively, the event that the protection film 17 is polished excessively in isolated pattern portions can be suppressed, and thus exposure of the word lines 14 and reduction in thickness by the polishing can be avoided. As a result, according to the first embodiment, the fine contact plugs can be relatively easily formed, yield of fabrication of the semiconductor device can be improved, and reliability of the semiconductor device can be improved.

In the first embodiment, the case where the plug insulating film is removed only by the CMP method is explained. However, the plug insulating film may be removed by the etching or a combination of the CMP method and the etching.

In addition, in the first embodiment, the case where the projection height of the surface of the device isolation regions 13 is relatively high and the plug insulating film remains on the protection film 17 on the device regions 12 is explained. However, if the method of the present invention is applied to the case where the projection height of the device isolation regions 13 is small, the protection film 17 on the device isolation regions 13 and the protection film 17 on the device regions 12 are exposed substantially simultaneously at the time of the CMP polishing. As a result, the plug insulating film does not remain on the protection film 17 on the device regions 12.

(Second Embodiment)

Figure 9A:
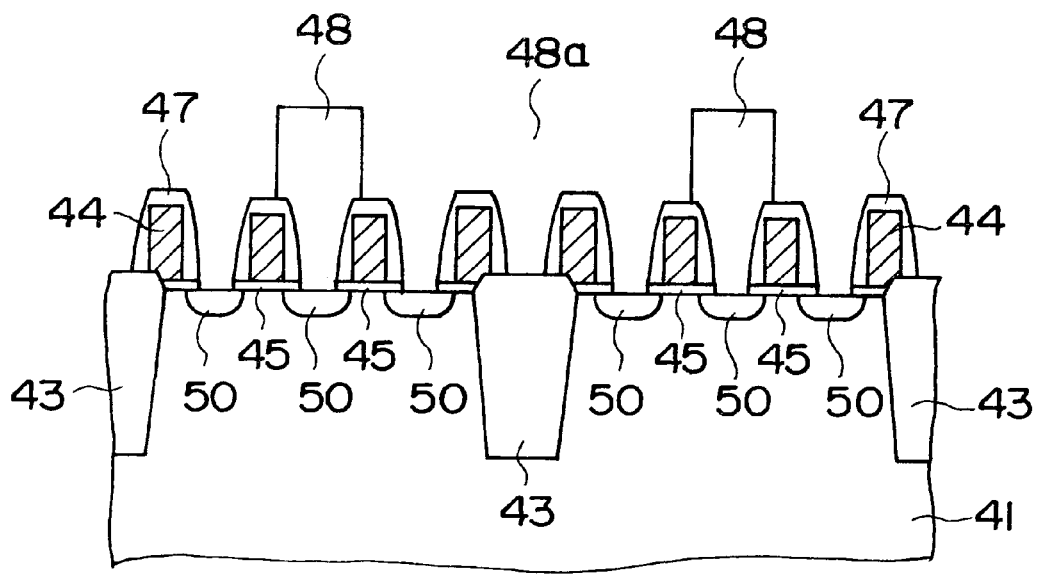
FIGS. 9A and 9B are sectional views showing a method of manufacturing a semiconductor device according to a second embodiment of the present invention.
Figure 9B:
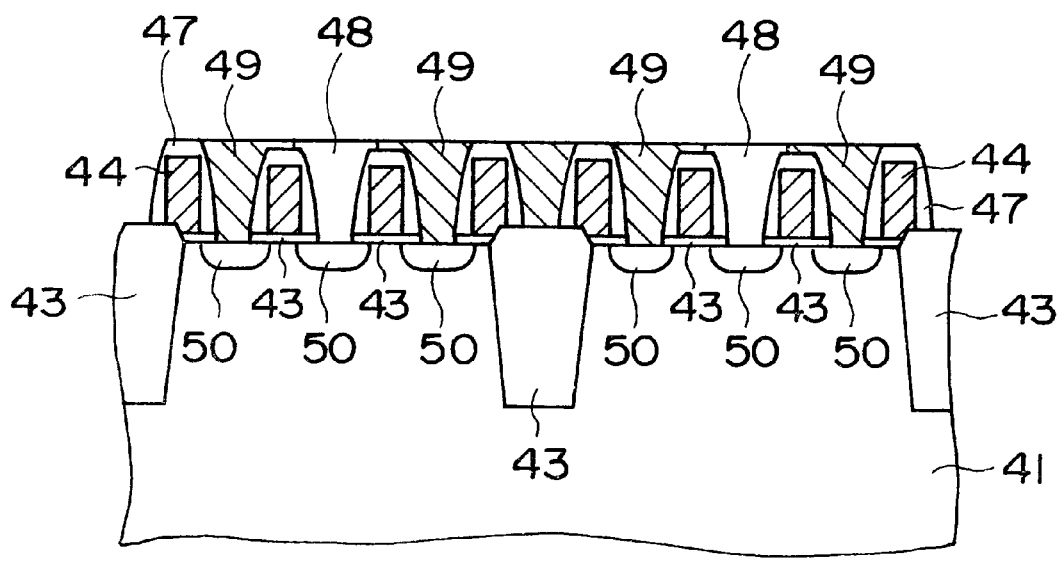
Figure 10:
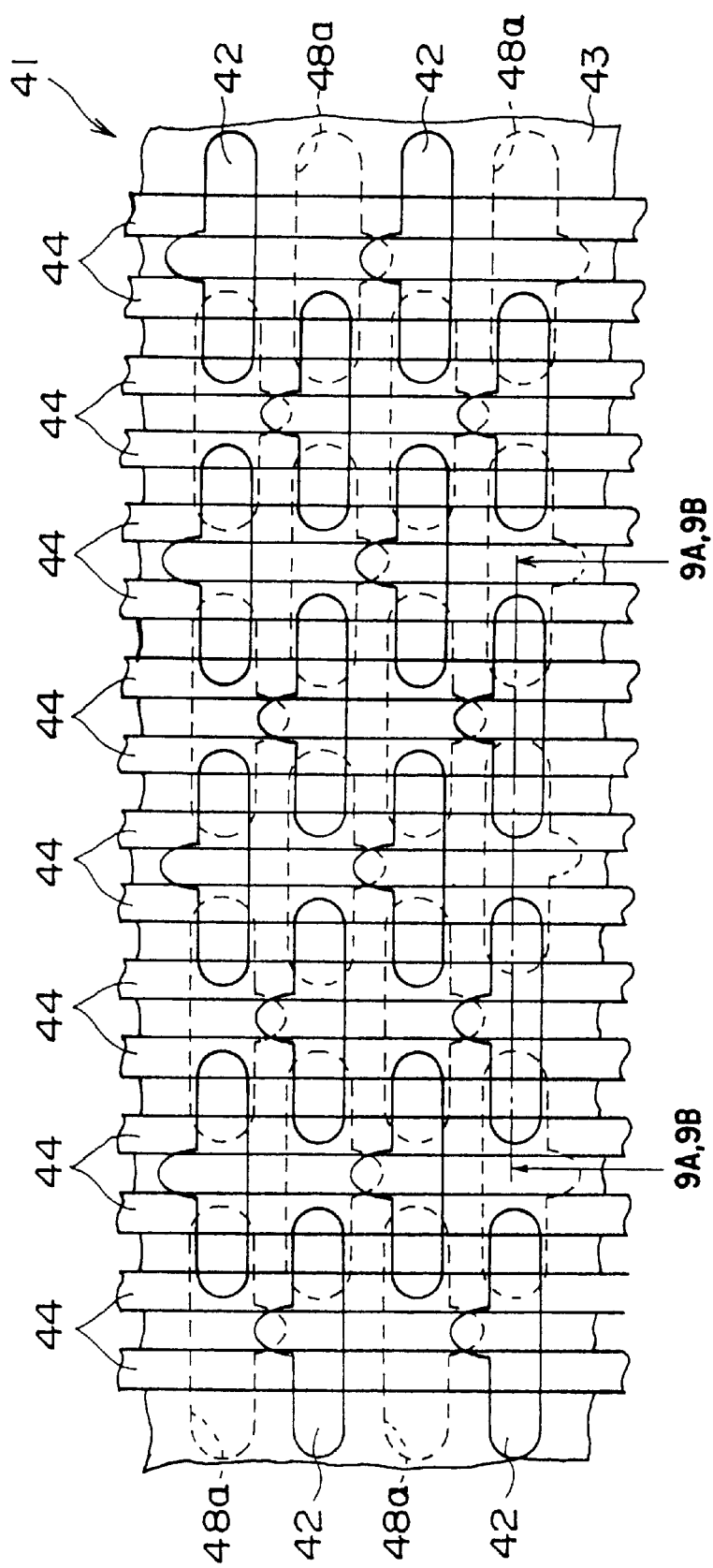
FIG. 10 is a top view showing a semiconductor substrate formed in steps shown in FIG. 9A.

FIGS. 9A and 9B are sectional views showing a method of manufacturing a semiconductor device according to a second embodiment of the present invention. FIG. 10 is a top view showing a semiconductor substrate formed in steps shown in FIG. 9A. In this case, a difference of the second embodiment from the first embodiment resides in that shapes of the device regions and shapes of the opening portions in the plug insulating film are formed differently. Since remaining portions of the second embodiment are similar to those in the first embodiment, their redundant explanation will be omitted. FIGS. 9A and 9B are sectional views taken at a position corresponding to a 9A, 9B–9A, 9B line in FIG. 10.

In the second embodiment, as shown in FIG. 9A and FIG. 10, the device isolation regions 43 are formed on the semiconductor substrate 41 such that, if viewed from the top, the device regions 42 are formed to have an oval rectangular shape having projections which project from its center portion to its side portion. Like the first embodiment, the device isolation regions 43 are formed by the STI method. Then, a plurality of word lines 44 that consist of conductive layer and projection layer are formed on the semiconductor substrate 41. In the second embodiment, the word lines 44 are formed such that such word lines 44 intersect orthogonally with the alignment direction of the device regions 42, two word lines 44 are passed over portions located in the neighborhood of a center portion of the device region 42, and the word lines 44 are passed over both end portions of the device region 42.

Then, impurity diffusion regions (LDD diffusion regions) 50 are formed by introducing the impurity into the device regions 42 on both sides of the word lines 44. Then, the protection film 47 is formed around the word lines 44 to cover the word lines 44.

Then, the plug insulating film 48 is formed on the overall upper surface of the semiconductor substrate 41, and then opening portions 48a are formed in the plug insulating film 48. In this case, as shown in FIG. 10, each opening portion 48a is formed to extend between two device regions 42 and to have the almost same shape as the device region 42. In this case, the direction of the projection of the device region 42 is set oppositely to the direction of the projection of the opening portion 48a, but the projection of the device region 42 and the projection of the opening portion 48a are overlapped with each other.

Then, the impurity-doped polysilicon is deposited on the overall upper surface of the semiconductor substrate 41 so as to bury the opening portions 42a and form a polysilicon film on the plug insulating film 42.

Then, the polysilicon film and the plug insulating film 48 are polished by the CMP method until the protection film 47 formed on the device isolation regions 43 is exposed. Accordingly, as shown in FIG. 9B, the polysilicon buried in the opening portions 48a are isolated by the plug insulating film 42 which remains on the protection film 47 formed on the device regions 42, or the protection film 47 on the device isolation regions 43. As a result, the contact plugs 49 which are isolated electrically mutually can be formed.

In the second embodiment, if the projection height of the device isolation regions 43 is high, the plug insulating film 48 still remains on the protection film formed on the device regions 42 and thus the short-circuit between the contact plugs 49 can be prevented without fail by the plug insulating film 48. Accordingly, like the first embodiment, such advantages can be achieved that the fine contact plugs can be formed relatively easily and the second embodiment can contribute to the higher integration and the higher yield of the semiconductor device.

As described above, according to the semiconductor device of the present invention, the second insulating film exists on the first insulating film on the device regions, and the contact plugs are isolated electrically mutually by the first insulating film or both the first insulating film and the second insulating film. Therefore, even if the device isolation regions are protruded from the surface of the semiconductor (surfaces of the device regions), the contact plugs can be isolated surely and thus generation of the short-circuit failure can be avoided.

Also, according to the method of manufacturing the semiconductor device of the present invention, the conductive layer (wirings) and the second insulating film covering the conductive film are formed on the semiconductor substrate, then the third insulating film is formed on the overall upper surface of the substrate, and then the opening portions are formed in the third insulating film to extend over a plurality of device regions and to come up to the impurity diffusion regions in the device regions respectively. Then, the conductor film is buried into the opening portions, and then the contact plugs are formed by removing the third insulating film and the conductor film by virtue of the CMP method, etc. Therefore, even if the level difference is caused between the surface of the device isolation regions and the surface of the device regions, the contact plugs can be isolated without fail. In addition, since the contact plugs can be isolated firmly by the small amount of polishing of the second insulating film, such advantages can prevent that generation of the disadvantages, i.e., the second insulating film covering the conductive layer in the isolated device portion is polished excessively to then expose the conductive film, etc. can be prevented, yield in manufacturing the semiconductor device can be improved, and the reliability of the semiconductor device can be improved.

What is claimed is:

1. A semiconductor device comprising:

a semiconductor substrate;

a plurality of device regions formed on the semiconductor substrate along a first direction;

device isolation regions provided between the device regions;

impurity diffusion regions formed in the device regions on the semiconductor substrate;

a plurality of conductive layers formed over the semiconductor substrate along a second direction which intersects with the first direction;

a first insulating film for covering the conductive layers;

a second insulating film formed on the first insulating film on the device regions; and a plurality of contact plugs which are isolated electrically mutually by the first insulating film on the device isolation regions and the first insulating film and the second insulating film on the device regions, and are connected electrically to the impurity diffusion regions.

2. A semiconductor device according to claim 1, wherein at least one of the conductive layers is arranged over the device regions and over regions between the device regions respectively.

3. A semiconductor device according to claim 1, wherein level difference is formed between the surfaces of the device regions and the surfaces of the device isolation regions.

4. A semiconductor device according to claim 1, wherein the contact plug is formed of polysilicon or metal.

5. A method of manufacturing a semiconductor device comprising the steps of:

partitioning a semiconductor substrate into a plurality of device regions by forming device isolation regions on the semiconductor substrate;

forming a first insulating film on at least the device regions;

forming a plurality of conductive layers to pass over the device isolation regions and the device regions;

forming impurity diffusion regions by introducing impurity into the semiconductor substrate on both sides of the conductive layers in the device regions;

covering peripheral regions of the conductive layers with a second insulating film;

forming a third insulating film on an overall upper surface of the semiconductor substrate containing the second insulating film;

forming opening portions in the third insulating film to extend over the plurality of device regions and to reach the impurity diffusion regions respectively;

forming a conductive film to bury the opening portions by depositing conductor on the semiconductor substrate containing the third insulating film; and removing the third insulating film and the conductive film until at least one of the second insulating film over the device isolation regions and the second insulating film over the device regions is exposed, to isolate electrically mutually the conductor buried in the opening portions, whereby contact plugs are formed.

6. A method of manufacturing a semiconductor device according to claim 5, wherein the plurality of device regions are formed along a same direction.

7. A method of manufacturing a semiconductor device according to claim 5, wherein the plurality of device regions are formed along first and second directions which intersect with each other.

8. A method of manufacturing a semiconductor device according to claim 5, wherein at least one of the conductive layers are formed over the device regions and over regions between the device regions respectively.

9. A method of manufacturing a semiconductor device according to claim 5, wherein the step of removing the third insulating film and the conductive film is carried out by chemical mechanical polishing.

10. A method of manufacturing a semiconductor device according to claim 9, further comprising the step of:

forming a stopper film whose polishing rate is low rather than the third insulating film and the conductive layers on an overall upper surface of the semiconductor substrate, between the step of covering peripheral regions of the conductive layers with the second insulating film and the step of forming the third insulating film.

* * * * *